US012785368B2

(12) United States Patent
Li et al.

(10) Patent No.: US 12,785,368 B2
(45) Date of Patent: Nov. 3, 2026

(54) POWER DISTRIBUTION MODULE FOR SWITCHGEAR AND SWITCHGEAR

(71) Applicant: Schneider Electric (China) Co., Ltd., Beijing (CN)

(72) Inventors: Huaying Li, Beijing (CN); Kun Liu, Beijing (CN)

(73) Assignee: Schneider Electric (China) Co., Ltd., Beijing (CN)

( * ) Notice: Subject to any disclaimer, the term of this patent is extended or adjusted under 35 U.S.C. 154(b) by 294 days.

(21) Appl. No.: 18/520,411

(22) Filed: Nov. 27, 2023

(65) Prior Publication Data

US 2025/0038492 A1 Jan. 30, 2025

(30) Foreign Application Priority Data

Jul. 26, 2023 (CN) ......................... 202321990617.3

(51) Int. Cl.
*H02B 1/30* (2006.01)
*H02B 1/21* (2006.01)
(Continued)

(52) U.S. Cl.
CPC ................. *H02B 1/21* (2013.01); *H02B 1/30* (2013.01); *H02B 1/36* (2013.01); *H02B 11/10* (2013.01); *H05K 7/1457* (2013.01)

(58) Field of Classification Search
CPC ... H02B 1/21; H02B 1/30; H02B 1/36; H02B 11/10; H05K 7/14329; H05K 7/1457
See application file for complete search history.

(56) References Cited

U.S. PATENT DOCUMENTS 3,217,211 A * 11/1965 Norden .................... H02B 1/36 439/378
4,011,424 A * 3/1977 Ericson .................. H02B 11/10 200/50.26
(Continued)

FOREIGN PATENT DOCUMENTS

CN 1564410 A 1/2005
CN 1280963 C * 10/2006
(Continued)

OTHER PUBLICATIONS

Extended European Search Report dated Apr. 2, 2024 for corresponding European Patent Application No. 23211977.6-1201, 11 pages.

*Primary Examiner* — Robert J Hoffberg
(74) *Attorney, Agent, or Firm* — Quinn IP Law

(57) ABSTRACT

Embodiments of the present disclosure provide a power distribution module for a switchgear and a switchgear. The power distribution module comprises a body adapted to be slidably connected to a fixed base plate of the switchgear in an installation direction to switch between at least an operation position, a test position and a disconnection position; a wire incoming end arranged on a connection side of the body toward a junction box of the switchgear and adapted to be electrically connected to an output end of the junction box after the body reaches the operation position; and a wire connection end arranged at intervals from the wire incoming end on the connection side and adapted to be electrically connected to an adapter end of the junction box after the body reaches the operation position or the test position. Accordingly, the mounting density of the power distribution modules in the switchgear can be increased, and the arrangement flexibility of the power distribution modules in the switchgear is improved.

19 Claims, 8 Drawing Sheets

(51) Int. Cl.

| | |
|---|---|
| ***H02B 1/36*** | (2006.01) |
| ***H02B 11/10*** | (2006.01) |
| ***H05K 7/14*** | (2006.01) |

(56) References Cited

U.S. PATENT DOCUMENTS

| | | | | |
|---|---|---|---|---|
| 4,761,521 | A * | 8/1988 | Beck | H02B 11/00<br>200/50.21 |
| 7,847,203 | B2 * | 12/2010 | Narayanan | H02B 11/12<br>200/50.26 |
| 8,641,432 | B2 * | 2/2014 | Northey | H01R 12/724<br>439/116 |
| 10,312,670 | B2 * | 6/2019 | Zhang | H02K 7/108 |
| 11,715,939 | B2 * | 8/2023 | Kang | H02B 11/133<br>361/622 |
| 2025/0038500 | A1 * | 1/2025 | Li | H02B 1/36 |
| 2025/0163876 | A1 * | 5/2025 | Wang | F02N 11/0862 |
| 2025/0372961 | A1 * | 12/2025 | Liu | H02B 1/30 |

FOREIGN PATENT DOCUMENTS

| | | | | | |
|---|---|---|---|---|---|
| CN | 101694929 | B | | 9/2011 | |
| CN | 107528249 | A | * | 12/2017 | H02B 11/173 |
| CN | 110890711 | A | * | 3/2020 | H02B 11/173 |
| CN | 217720476 | U | | 11/2022 | |
| CN | 120049279 | A | * | 5/2025 | H02B 11/127 |
| KR | 101178740 | B1 | * | 8/2012 | H02B 11/133 |
| KR | 101194385 | B1 | * | 10/2012 | H02B 11/173 |
| WO | WO-03036772 | A1 | * | 5/2003 | H02B 1/56 |
| WO | WO-03038961 | A1 | * | 5/2003 | H02B 1/36 |
| WO | WO-03038962 | A1 | * | 5/2003 | H02B 1/21 |
| WO | WO-2019052302 | A1 | * | 3/2019 | H02B 11/133 |

* cited by examiner

POWER DISTRIBUTION MODULE FOR SWITCHGEAR AND SWITCHGEAR

FIELD

Embodiments of the present disclosure generally relate to the field of electrical equipment, and more specifically, to a power distribution module for a switchgear and a switchgear.

BACKGROUND

A switchgear refers to a complete set of power distribution devices by assembling primary and secondary equipment according to a certain plan, and is mainly used to control and protect lines and equipment. Switchgears may be divided into high-voltage switchgears and low-voltage switchgears according to the voltage level of the incoming and outgoing lines. A power distribution module is arranged within the switchgear and the switchgear supplies power to the power distribution module in a form of a supply busbar.

The layout of the wire incoming end and wire connection end of the existing power distribution modules is unreasonable, resulting in the power distribution modules occupying a large space in the switchgear, and the arrangement density of the power distribution modules in the switchgear is low.

SUMMARY

In a first aspect of the present disclosure, a power distribution module for a switchgear is provided. The power distribution module comprises: a body adapted to be slidably connected to a fixed base plate of the switchgear in an installation direction to switch between at least an operation position, a test position and a disconnection position: a wire incoming end arranged on a connection side of the body toward a junction box of the switchgear and adapted to be electrically connected to an output end of the junction box after the body reaches the operation position; and a wire connection end arranged on the connection side at intervals from the wire incoming end and adapted to be electrically connected to an adapter end of the junction box after the body reaches the operation position or the test position In some embodiments, the wire connection end and the wire incoming end are arranged to be spaced apart by a predetermined distance in a height direction.

In some embodiments, the power distribution module further comprises: a handle arranged on an operation side of the body away from the connection side for being operated to slide the body in the installation direction.

In some embodiments, the power distribution module further comprises: a position indication assembly, comprising: an articulated arm pivotally coupled within the body and adapted to rotate along a pivot axis; a contact plate coupled to the articulated arm and adapted to be pushed by an indication base block of the fixed base plate during sliding of the body along the installation direction and to push the articulated arm to rotate; and an indication plate coupled to an end of the articulated arm away from the pivot axis to indicate position information of the body relative to the fixed base plate through a rotational position of the articulated arm.

In some embodiments, the body comprises an indication window arranged on an operation side of the body away from the connection side to expose at least a portion of the indication plate.

In some embodiments, the position indication assembly further comprises: a torsion spring, one end of which is coupled to the body and the other end of which is coupled to the articulated arm, the torsion spring adapted to provide a torsion force to make the contact plate in close contact with the indication base block.

In some embodiments, the power distribution module further comprises an interlocking member slidably connected to the body in a height direction, and adapted to, after the body slides to the operation position and the test position, be inserted into a positioning hole on the fixed base plate so as to fix the body and the fixed base plate along the installation direction.

In some embodiments, the wire incoming end comprises: a plurality of inserts each comprising an elastic protrusion adapted to be compressed during insertion of the plurality of inserts into a supply busbar of the junction box such that the plurality of inserts and the supply busbar are reliably electrically connected.

In some embodiments, the power distribution module further comprises: a pulley arranged on an underside of the body adjacent to the fixed base plate and adapted to be coupled with a slide rail on the fixed base plate during sliding of the body relative to the fixed base plate.

By simultaneously arranging the wire incoming end and wire connection end of the power distribution module on the connection side of the power distribution module, and by arranging the wire incoming end and the wire connection end along the height direction, the wiring layout of the power distribution module is optimized. Users can also choose to install multiple quantities and specifications of power distribution modules along the lateral direction in the same layer of the switchgear according to actual needs.

In a second aspect of the present disclosure, a switchgear is provided. The switchgear comprises: a cabinet: a fixed base plate fixedly coupled within the cabinet: power distribution modules according to the first aspect of the present disclosure, slidably arranged on the fixed base plate in a lateral direction; and a junction box adapted to be electrically connected to the power distribution modules.

In some embodiments, the fixed base plate comprises a plurality of slide rails arranged in the lateral direction and adjacent slide rails are spaced apart by a predetermined distance, a length direction of each slide rail is arranged in an installation direction, wherein a pulley of the power distribution module is arranged to be coupled to any one of the plurality of slide rails.

It should be understood that the content described in this section is not intended to limit critical or important features of embodiments of the present disclosure, nor is it used to limit the scope of the present disclosure. Other features of the present disclosure will become easier to be understood through the following description.

BRIEF DESCRIPTION OF THE DRAWINGS

The above and other features, advantages, and aspects of each embodiment of the present disclosure will become more apparent in conjunction with the accompanying drawings and with reference to the following detailed explanations. In the accompanying drawings, the same or similar reference symbols represent the same or similar elements, where.

DETAILED DESCRIPTION

Figure 1:
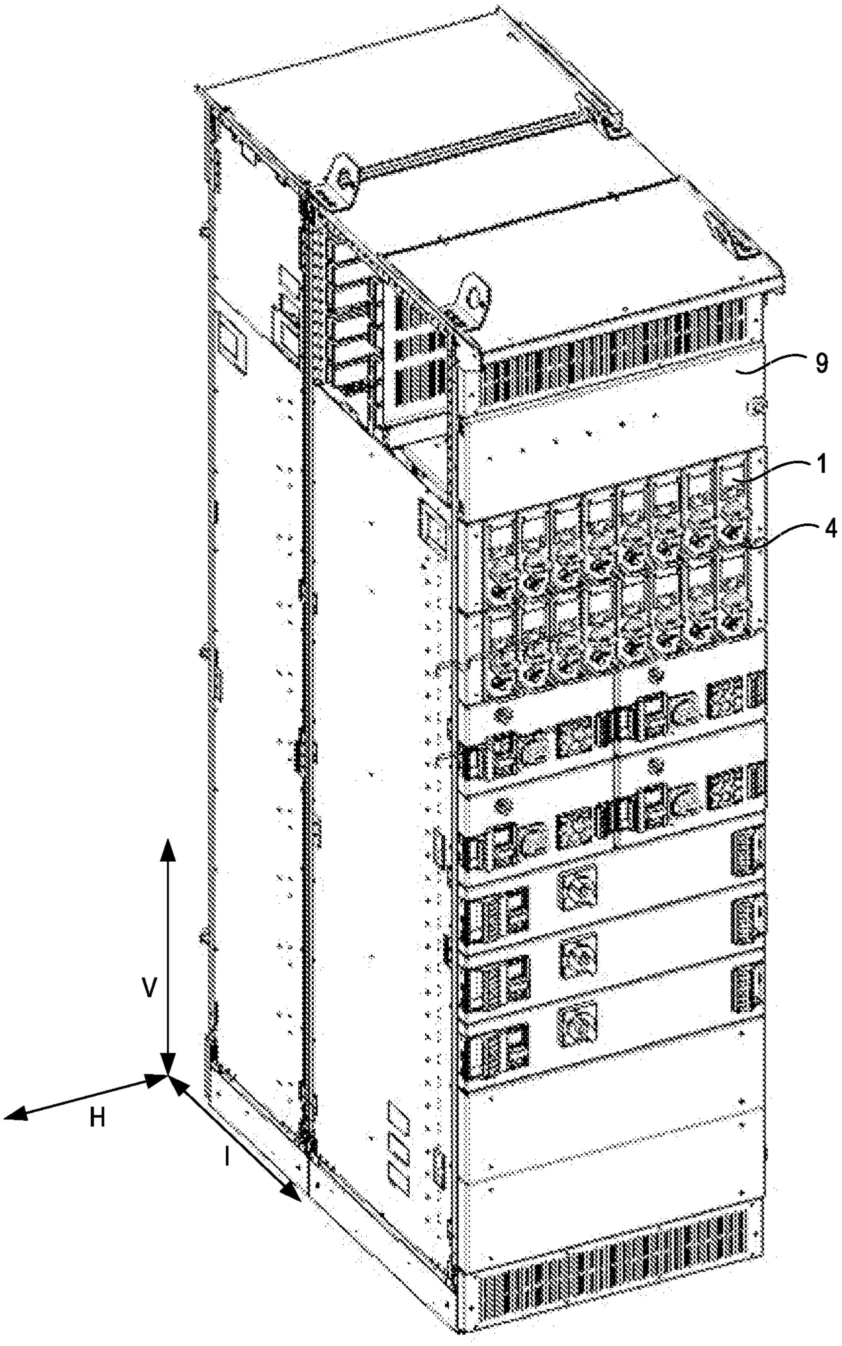
FIG. 1 shows a schematic diagram of the overall structure of a switchgear according to embodiments of the present disclosure.

Embodiments of the present disclosure will be described in more detail below with reference to the accompanying drawings. Although certain embodiments of the disclosure are illustrated in the drawings, it should be understood that the present disclosure may be embodied in various forms and should not be construed as limited to the embodiments set forth herein, but rather, these embodiments are provided for a more thorough and complete understanding of the present disclosure. It should be understood that the drawings and embodiments of the present disclosure are for illustrative purposes only and are not intended to limit the scope of the present disclosure.

It should be noted that any section/subsection headings provided herein are not limiting. Various embodiments are described throughout herein, and any type of embodiment may be included under any section/subsection. Furthermore, embodiments described in any section/subsection may be combined in any manner with any other embodiments described in the same section/subsection and/or in a different section/subsection.

The term "comprise" and its variants used herein indicate open inclusion, that is, "comprising but not limited to". The term "based on" should be interpreted as "based at least in part on". The terms "an embodiment" or "the embodiment" should be interpreted as "at least one embodiment". The term "some embodiments" should be interpreted as "at least some embodiments". Other explicit and implicit definitions may be included below. The terms "first", "second", etc., may refer to different or the same object. Other explicit and implicit definitions may also be included below.

As briefly mentioned above, the space occupied by power distribution modules in the form of drawers arranged in a switchgear is large, resulting in a low arrangement density of the power distribution modules. Specifically, in some prior arts, the side (hereinafter referred to as the connection side) of the power distribution module away from users is arranged with a wire incoming end, which is electrically connected to a junction box in the switchgear and supplies power to the power distribution module through a main primary plug-in (i.e., a plug closer to the main input busbar than the junction box) coupled to the junction box. At the same time, the power distribution module is also provided with a wire connection end, which is arranged on a side wall of the power distribution module adjacent to the connection side. The setting position and setting method of the wire connection end of the power distribution module additionally occupy the space in the switchgear.

On the one hand, this wiring method makes wiring in the switchgear difficult and inconvenient for the installation and maintenance of power distribution modules in the switchgear. On the other hand, the installation method of the power distribution modules in the switchgear is limited, and it is difficult to adjust the number and specifications of the power distribution modules for the switchgear according to actual needs.

Embodiments of the present disclosure propose a power distribution module for a switchgear to solve or at least partially solve the above problems and other potential problems existing in traditional solutions. According to various embodiments of the present disclosure, by arranging a wire incoming end and a wire connection end of a power distribution module simultaneously on the connection side of the power distribution module, and by arranging the wire incoming end and the wire connection end along the height direction, the wiring layout of the power distribution module is optimized. Users can also choose to install multiple quantities and specifications of power distribution modules along the lateral direction in the same layer of a switchgear according to actual needs. For example, according to actual needs, in the same layer of the switchgear, ⅛ power distribution modules (⅛ power distribution module means that up to eight ⅛ power distribution modules can be accommodated simultaneously in the lateral direction of the same layer of switchgear), ¼ power distribution modules (¼ power distribution module means that up to four ¼ power distribution modules can be accommodated simultaneously in the lateral direction of the same layer of switchgear), and ½ power distribution modules (½ power distribution module means that up to two ½ power distribution modules can be accommodated simultaneously in the lateral direction of the same layer of switchgear) or any other appropriate specifications of power distribution modules can be installed simultaneously in the lateral direction. On the other hand, users can arbitrarily adjust coupling positions of the power distribution modules in the switchgear as needed. Specifically, users can adjust the installation positions of the power distribution modules in a switchgear by coupling the power distribution modules to different positions of a slide rail on a fixed base plate, which not only improves the arrangement density of power distribution modules, but also improves the flexibility in the layout of power distribution modules within the switchgear.

Meanwhile, the power distribution module according to embodiments of the present disclosure can be installed in an existing switchgear, and can be mixed in the height direction with distribution devices such as drawers or the like within the existing switchgear, further improving the arrangement flexibility of power distribution modules within the switchgear.

Figure 2:
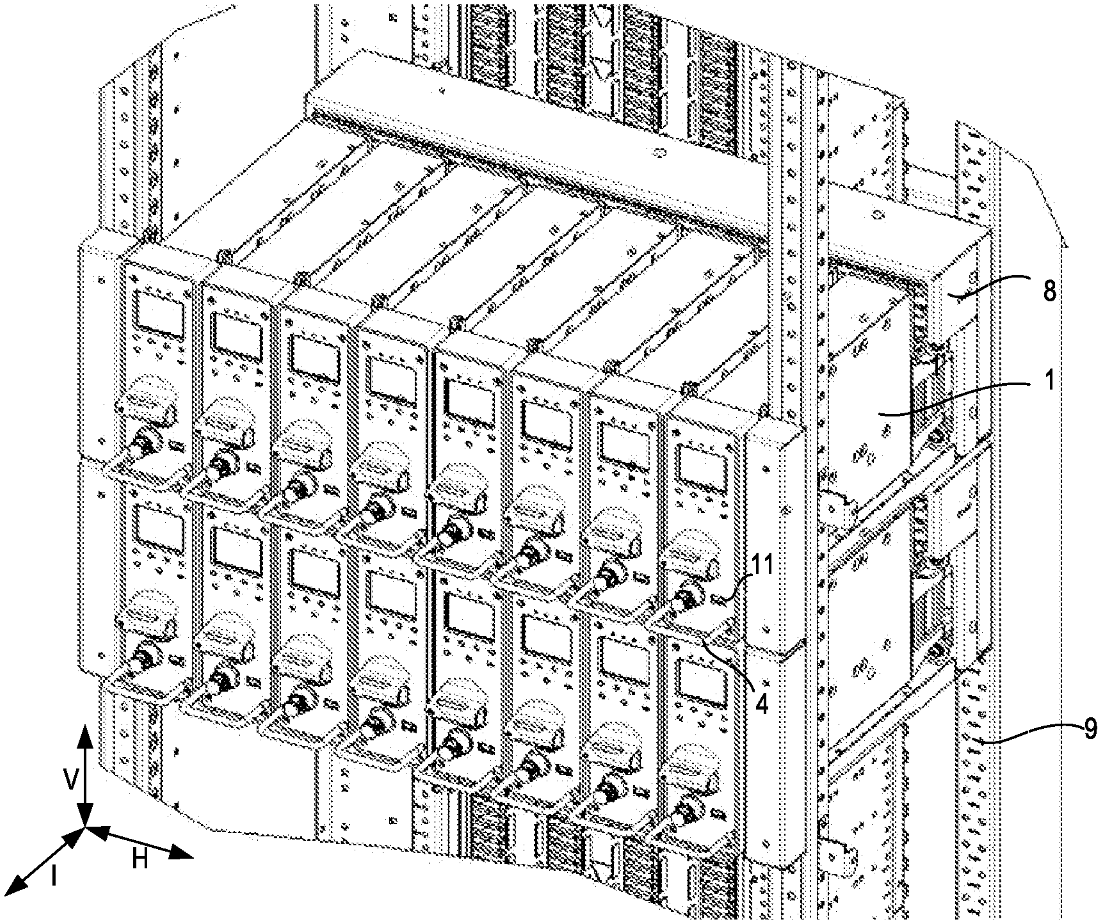
FIG. 2 shows a schematic diagram of fully loaded power distribution modules in the switchgear according to embodiments of the present disclosure.
Figure 3:
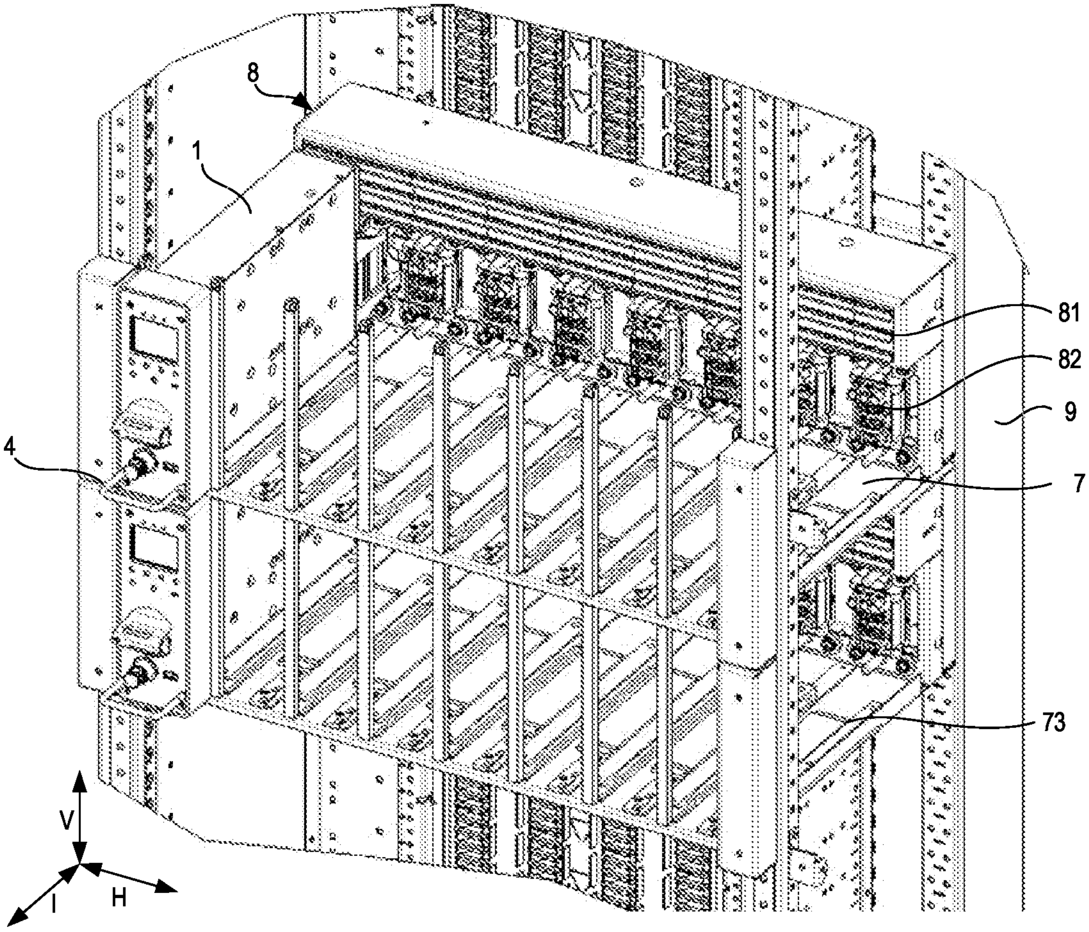
FIG. 3 shows a schematic diagram of partially loaded power distribution modules in the switchgear according to embodiments of the present disclosure.

FIG. 1 shows a schematic diagram of the overall structure of the switchgear according to embodiments of the present disclosure, FIGS. 2 and 3 show schematic diagrams of fully loaded power distribution modules and partially loaded power distribution modules within a switchgear, respectively.

As shown in FIGS. 1, 2 and 3, a switchgear proposed according to embodiments of the present disclosure generally comprises a cabinet 9, a fixed base plate 7 coupled to the cabinet 9, a junction box arranged above the fixed base plate 7 and coupled to the cabinet 9, and power distribution modules slidably connected to the fixed base plate 7 along the installation direction I. In some embodiments, the power distribution module may also be referred to as a drawer. As shown in FIGS. 1 to 3, a plurality of layers of fixed base plates 7 can be arranged in the cabinet 9 as needed. According to embodiments of the present disclosure, the concept of the present disclosure is described by taking the case where the power distribution modules are coupled to one of the plurality of layers of fixed base plates 7 as an example. Embodiments where the power distribution modules are coupled to other layers or multiple layers of fixed base plate 7 are also similar and will not be repeated separately below.

Figure 4:
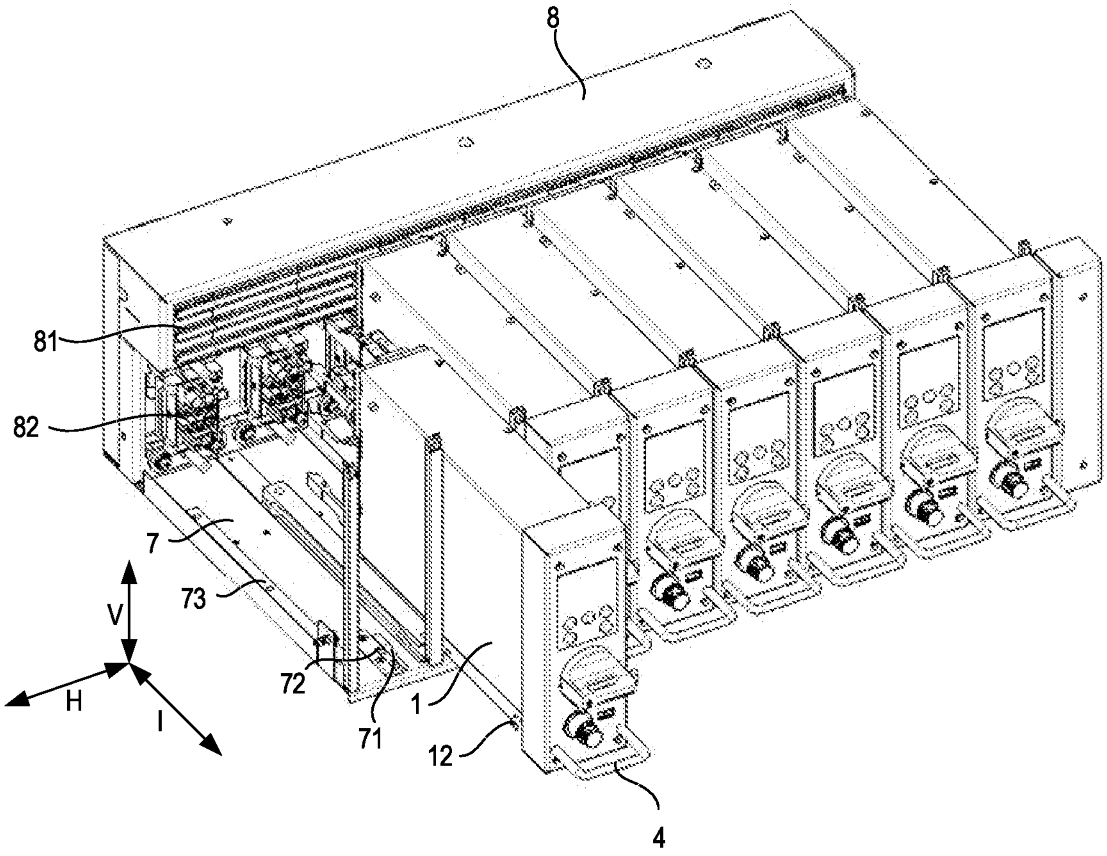
FIG. 4 shows a schematic diagram of power distribution modules in an installation state according to embodiments of the present disclosure.

FIG. 4 shows a schematic diagram of power distribution modules in an installation state according to embodiment of the present disclosure. As shown in FIG. 4, the power distribution module comprises a body 1, a wire incoming end 2 and a wire connection end 3 arranged on a side (hereinafter also referred to as a connection side) of the body 1 toward the junction box. When the body 1 slides along the installation direction I towards the junction box 8 on the fixed base plate 7, the wire incoming end 2 can be electrically connected to an output end 81 of the junction box 8, so that the junction box can supply power to the power distribution module through its output end 81. The wire connection end 3 can be electrically connected to an adapter end 82 of the junction box 8, so that the power electricity, control electricity and signal electricity output by the power distribution module can be input to the junction box 8, and then output to the corresponding electrical appliances through cables connected to the junction box 8.

In some embodiments, the power electricity refers to electricity with high voltage (such as 220V, 380V, etc.) and large current used for power supply to loads in the main circuit, while the control electricity refers to electricity with low voltage (such as 24V, 36V) and small current used for power supply to controllers. The signal electricity can be used to output electrical signals about the operation of the power distribution module.

In some embodiments, the power distribution module comprises a main power unit, an isolation unit, a forward and reverse unit, an auxiliary unit, an isolation operating mechanism, etc., to complete at least the corresponding power supply tasks in the circuit. The main power unit, the isolation unit, the forward and reverse unit, the auxiliary unit, and the isolation operating mechanism in the power distribution module can each adopt a modularization design. The modularization design here means that these units or mechanisms in the power distribution module are individually packaged, and prefabricated connections are used between these units and between units and mechanisms, thereby improving reliability while reducing latent risks to safety.

Figure 5:
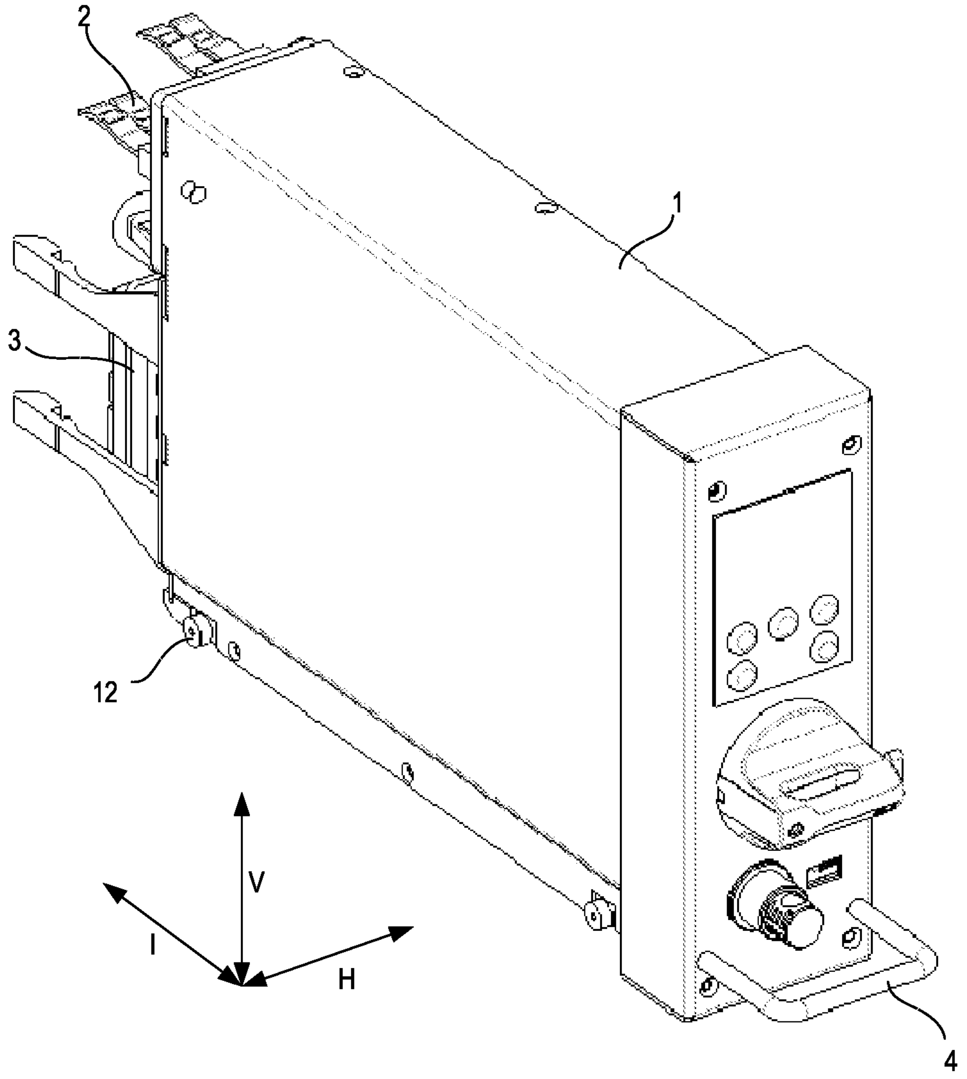
FIG. 5 shows a schematic diagram of the overall structure of a power distribution module according to embodiments of the present disclosure.
Figure 6:
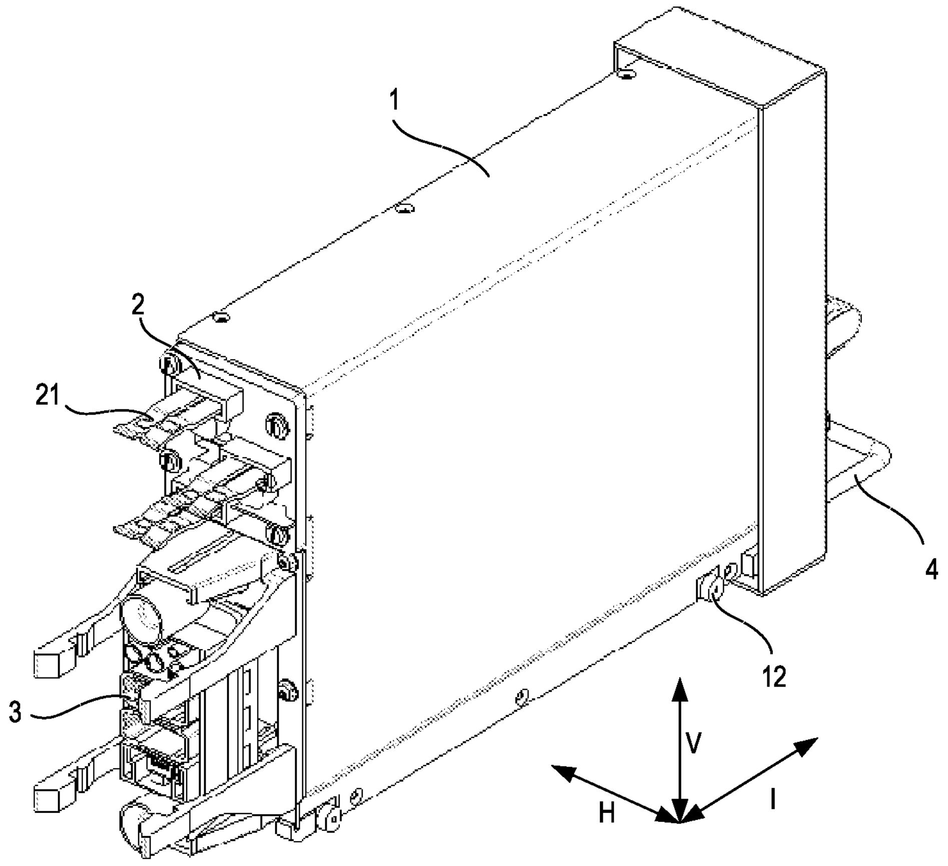
FIG. 6 shows a schematic diagram of the overall structure of the power distribution module from another perspective according to embodiments of the present disclosure.

FIGS. 5 and 6 show schematic diagrams of the overall structure of the power distribution module in different perspectives according to embodiments of the present disclosure. As shown in FIGS. 5 and 6, in some embodiments, the wire incoming end 2 and the wire connection end 3 of the power distribution module are arranged along the height direction V, and the wire incoming end 2 and the wire connection end 3 are spaced apart by a predetermined distance (such as 3 cm, 5 cm, etc.), so that when the power distribution module is coupled to the junction box 8 along the installation direction I, the wire incoming end 2 and the wire connection end 3 can be accurately connected to the output end 81 and the adapter end 82 of the junction box, respectively. On the other hand, the arrangement of the wire incoming end 2 and the wire connection end 3 along the height direction V optimizes the layout of the power distribution module and facilitates the arrangement of multiple power distribution modules in the switchgear along the lateral direction H. Meanwhile, such a layout also allows the power distribution modules to be mounted in a plurality of positions along the lateral direction H of the fixed base plate 7, to improve arrangement flexibility of the power distribution module within the switchgear.

As shown in FIGS. 5 and 6, in some embodiments, the wire incoming end 2 comprises a plurality of inserts 21, and the inserts 21 comprise elastic protrusions. During insertion of the insert 21 into the supply busbar in the junction box 8, the elastic protrusions can be compressed by side walls of the supply busbar, and the elastic protrusions are pressed against the side walls of the supply busbar by their own elastic force, so that a stable electrical connection can be obtained between the insert 21 and the supply busbar. In some embodiments, the number of inserts 21 can correspond to the number of phases of the power supply. For example, when the power supply is three-phase, the number of inserts 21 can be three. It should be understood that in some other embodiments, if the number of phases of the power supply has other numbers (such as two phases or four phases etc.), the inserts 21 can also have corresponding numbers (two or four, etc.).

In some embodiments, the wire connection end 3 may be a first outlet plug-in. Correspondingly, the adapter end 82 on the junction box 8 may be coupled with a second outlet plug-in. When the power distribution module slides along the installation direction I, the first outlet plug-in is coupled to the second outlet plug-in, so that the wire connection end 3 of the power distribution module is electrically connected to the adapter end 82 of the junction box 8. In some embodiments, the first outlet plug-in and the second outlet plug-in may be in the form of male and female plug-ins, for example, the first outlet plug-in may be a female plug-in, and the second outlet plug-in may be a male plug-in. When the power distribution module and the junction box 8 are close to each other, the second outlet plug-in is inserted into and electrically connected to the first outlet plug-in. Of course, in some other embodiments, the first outlet plug-in is arranged as a male plug-in, and the second outlet plug-in is arranged as a female plug-in, which is not repeated here.

As shown in FIGS. 3 and 4, in some embodiments, the fixed base plate 7 comprises a plurality of slide rails 73 which are arranged in the lateral direction H, and the length direction of each slide rail 73 is parallel to the installation direction I. As shown in FIGS. 5 and 6, the power distribution module comprises a pulley 12, which is rotatably coupled to the body 1. When the power distribution module slides along the installation direction I on the slide rail 73, the pulley 12 is clamped inside the slide rail 73, and the pulley 12 rolls along the installation direction I on the surface of the slide rail 73, thereby reducing friction during sliding of the power distribution module on the fixed base plate 7. Meanwhile, the cooperation of the slide rail 73 and the pulley 12 makes the sliding of the power distribution module on the fixed base plate 7 along the installation direction I more stable, thereby ensuring the coupling accuracy between the wire incoming end 2 and the output end 81, and between the wire connection end 3 and the adapter end 82.

In some embodiments, a handle 4 may be arranged on a side (hereinafter also referred to as "an operation side") of the body 1 away from the junction box 8. The handle 4 is adapted for user operation to control at least the sliding of the power distribution module on the fixed base plate 7.

When the power distribution module slides along the installation direction I on the fixed base plate 7, the power distribution module has at least three state positions to correspond to different work requirements. The power distribution module slides along the installation direction I to the junction box 8 and is fully coupled to the junction box 8, and the power distribution module reaches an operation position. At this position, the wire incoming end 2 of the power distribution module is coupled to the output end 81 of the junction box 8, and at the same time, the wire connection end 3 of the power distribution module is coupled to the adapter end 82 of the junction box 8, and the power distribution module is in normal operation condition. When the power distribution module slides a predetermined distance from the operation position in a direction away from the junction box 8, it reaches a test position. At this position, the wire incoming end 2 of the power distribution module is disconnected from the output end 81 of the junction box 8. The wire connection end 3 of the power distribution module is coupled to the adapter end 82 of the junction box 8, and the power distribution module is in a test state. Users can test the operation of the power distribution module in this state. When the power distribution module continues to slide a predetermined distance away from the junction box 8 from the test position, the wire incoming end 2 of the power distribution module is disconnected from the output end 81 of the junction box 8, and the wire connection end 3 of the power distribution module is disconnected from the adapter end 82 of the junction box 8. At this time, users can completely remove the power distribution module from the fixed base plate 7.

In some embodiments, the fixed base plate 7, the junction box 8 and a plurality of power distribution modules may be modularly arranged in a plurality of groups along the height direction in the switchgear 9. In use, users can flexibly adjust the layout of the groups and the layout of the power distribution modules within each group according to actual needs.

Figure 7:
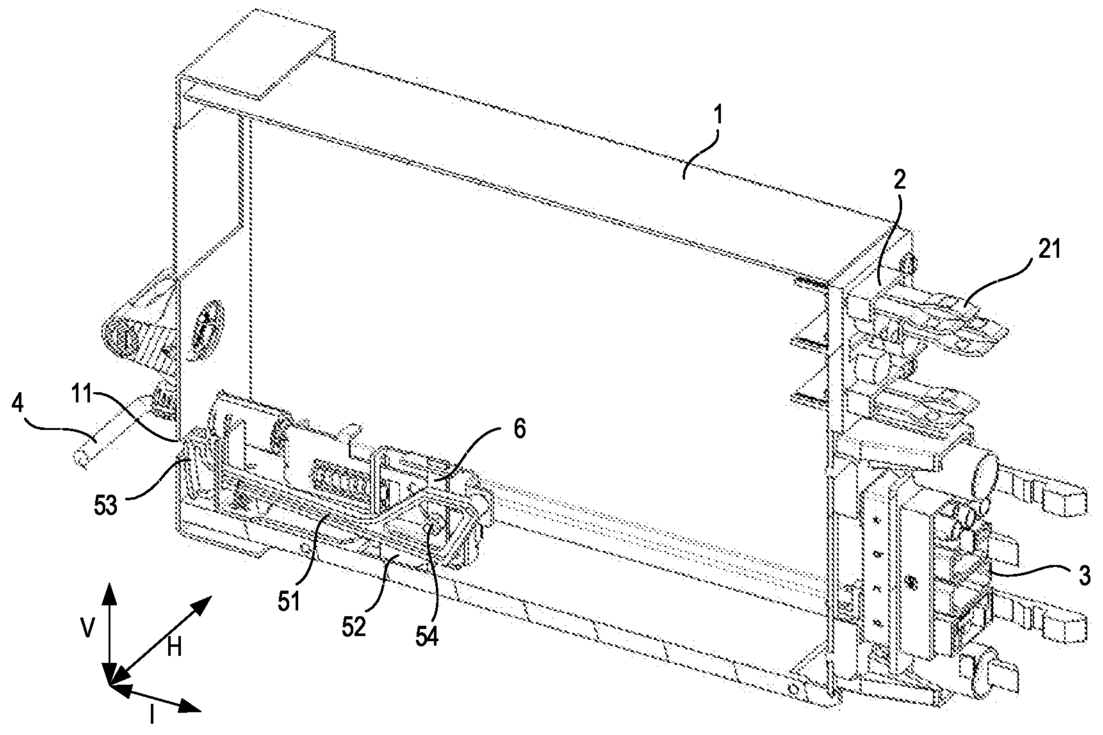
FIG. 7 shows a schematic diagram of the internal structure of the power distribution module according to embodiments of the present disclosure.
Figure 8:
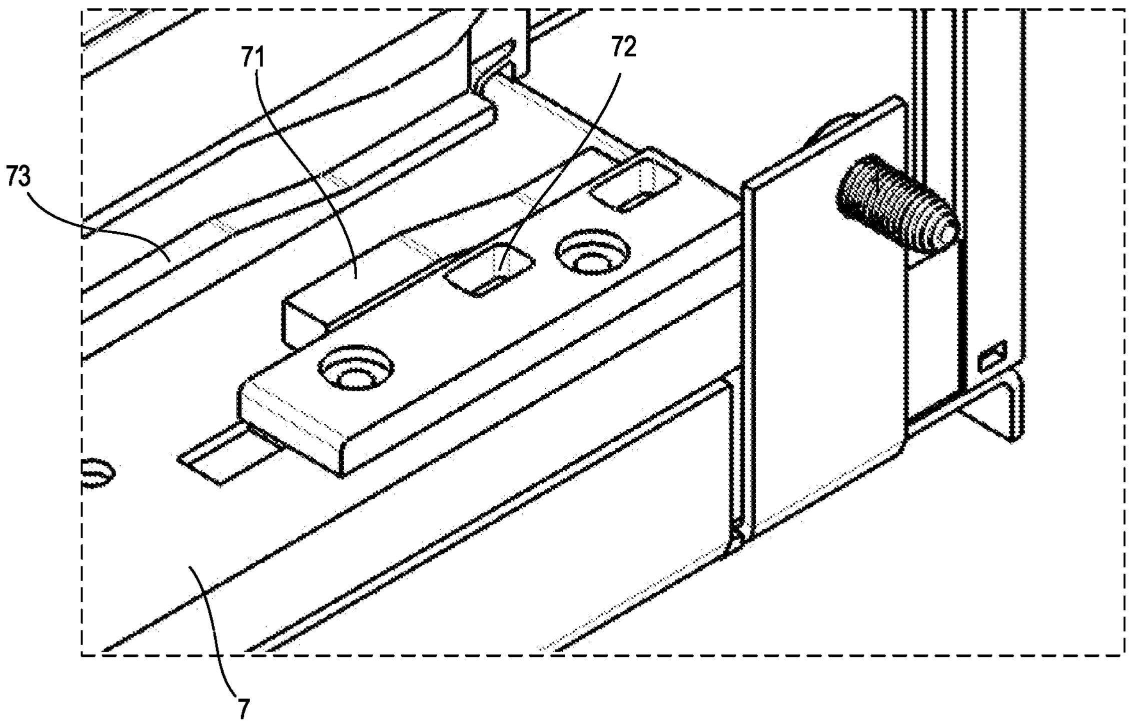
FIG. 8 shows a schematic diagram of a structure of a fixed base plate according to embodiments of the present disclosure.

FIG. 7 shows a schematic diagram of the internal structure of the power distribution module according to embodiments of the present disclosure, and FIG. 8 shows a schematic diagram of the structure of the fixed base plate according to embodiments of the present disclosure. As shown in FIGS. 7 and 8, in some embodiments, the power distribution module further comprises a position indication assembly 5. The position indication assembly 5 cooperates with the indication base block 71 coupled to the fixed base plate 7 to display the position information of the power distribution module at different state positions. The position indication assembly 5 comprises an articulated arm 51, a contact plate 52, and an indication plate 53. one end of the articulated arm 51 is pivoted on the body 1, so that the articulated arm 51 can rotate about the pivot axis, and the other end of the articulated arm 51 is coupled to the indication plate 53, or it may be said that the indication plate 53 is coupled to or integrated with the other end of the articulated arm 51. The contact plate 52 is coupled to the articulated arm 51, and the contact plate 52 abuts the indication base block 71. With the sliding of the power distribution module in the installation direction I, the contact plate 52 moves on the surface of the indication base block 71 and abuts against different positions (hereinafter also referred to as contact surfaces) of the indication base block 71. The contact plate 52 is pushed by the different contact surfaces of the indication base block 71 and drives the articulated arm 51 to rotate, so that the position of the indication plate 53 relative to the body 1 is changed, and according to the position change of the indication plate 53 relative to the position of the body 1, the position information of the power distribution module in different state positions, that is, the position of the power distribution module relative to the fixed base plate is shown.

For example, in some embodiments, the pivot axis of the articulated arm 51 extends in the lateral direction H. Correspondingly, the indication base block 71 has a plurality of contact surfaces, and each contact surface is at a different distance from the fixed base plate 7. When the power distribution module slides along the installation direction I on the fixed base plate 7, the contact plate 52 contacts with different contact surfaces on the indication base block 71, the contact plate 52 is pushed by the different contact surfaces on the base block 71 to drive the articulated arm 51 to rotate, and further promotes the position change of the indication plate 53 relative to the body 1 to show the position information of the power distribution module.

In some alternative embodiments, the pivot axis of the articulated arm 51 may not extend in the lateral direction H, for example, the pivot axis of the articulated arm 51 may extend in the height direction V. Correspondingly thereto, the contact surfaces of the indication base block 71 may be offset in the lateral direction H. When the power distribution module slides along the installation direction I, the contact plate 52 abuts against the contact surface of the indication base block 71, and may be pushed by the contact surface with a pushing force parallel to the lateral direction H, thereby driving the articulated arm 51 to rotate and causes the position change of the indication plate 53 relative to the body 1.

It should be understood that the above description of the rotation direction of the articulated arm 51 and the arrangement direction of the contact surfaces 71 on the indication base block is merely illustrative and is not intended to limit the scope of the present disclosure. In fact, during sliding of the power distribution module along the installation direction I, any method of the contact plate 52 being pushed by the indication base block 71 to drive the articulated arm 51 to rotate can be used in the present disclosure.

In some embodiments, the position indication assembly 5 further comprises a torsion spring 54. One end of the torsion spring 54 is coupled to the body 1, the other end is coupled to the articulated arm 51. The torsion spring 54 is adapted to provide a torsion force to ensure that the contact plate 52 and the contact surface of the indication base block 71 is in close contact, thereby improving the accuracy of the position information shown by the position indication assembly 5.

In some embodiments, the position indication assembly 5 is arranged inside the body 1. For example, an indication window 11 is opened on the operation side of the body 1. The indication window 11 is adapted to expose at least a portion of the indication plate 53. Users can determine the current position information of the power distribution module by the information of the indication plate 53 shown in the indication window 11. In some embodiments, different identification information may also be marked on the indication plate 53. As mentioned above, as the power distribution module slides along the installation direction I, the contact plate 52 moves on the surface of the indication base block 71 and abuts against different positions of the indication base block 71. The contact plate 52 is pushed by different contact surfaces of the indication base block 71 to drive the articulated arm 51 to rotate, so that when the indication plate 53 is displaced relative to the body 1, the identification information of indication plate 53 exposed from the indication window 11 is changed, thereby facilitating users to determine the current position information of the power distribution module.

In some embodiments, the power distribution module further comprises an interlocking member 6. The interlocking member 6 is arranged in the body 1 and slidably connected to the body 1 along the height direction V. A plurality of positioning holes 72 are opened on the fixed base plate 7 along the installation direction I. When the power distribution module slides to a specific state position (e.g., the operation position, the test position, etc.), the interlocking member 6 is inserted into the positioning hole 72. The interlocking member 6 cooperates with the positioning hole 72 arranged on the fixed base plate 7, so that the body 1 and the fixed base plate 7 are fixed along the installation direction I.

In some embodiments, the interlocking member 6 may be driven by a mechanical or electronic mechanism to complete the unlocking (i.e., the interlocking member 6 is displaced away from the positioning hole 72 and separated from the positioning hole 72). For example, an electromagnet can be provided inside the body 1, and the interlocking member 6 is separated from the positioning hole 72 by the suction of the electromagnet. It should be understood that the above illustration of the mechanical or electronic mechanism to complete the unlocking is merely illustrative, and is not intended to limit the scope of the present disclosure. In fact, any mechanism that can drive the interlocking member 6 to move and separate from the positioning hole 72 to complete the unlocking is possible. For example, in some embodiments, a mechanical or electronic switch or an operating handle used to unlock the interlocking member 6 can be integrated on the handle 4. When users control the sliding of the power distribution module using the handle 4, they can simultaneously control the start and stop of the mechanical or electronic mechanism.

The above has described the various implementations of the present disclosure. The above description is exemplary, not exhaustive, and is not limited to the various implementations disclosed. Without departing from the scope and spirit of the various implementations described, many modifications and changes are obvious to those skilled in the art. The choice of terms used herein is intended to best explain the principles, practical applications, or improvements to the technology in the market, or to enable other ordinary technicians in the art to understand the various implementations disclosed in this article.

What is claimed is:

1. A power distribution module comprising:

a body adapted to be slidably connected to a fixed base plate of a switchgear in an installation direction to switch between at least an operation position, a test position, and a disconnection position relative to a junction box of the switchgear;

a wire incoming end arranged on a connection side of the body toward the junction box and adapted to be electrically connected to an output end of the junction box when the body reaches the operation position;

a wire connection end arranged on the connection side at a predetermined distance from the wire incoming end and adapted to be electrically connected to an adapter end of the junction box when the body reaches the operation position or the test position; and a position indication assembly comprising:

an indication plate to indicate position information located internally to the body relative to the fixed base plate, an articulated arm pivotally coupled within the body and adapted to rotate along a pivot axis; and a contact plate coupled to the articulated arm and adapted to be pushed in a height direction by an indication base block of the fixed base plate during sliding of the body along the installation direction and to push the articulated arm to rotate, wherein the junction box is arranged in a lateral direction, and wherein the body is removable from the fixed base plate at the disconnection position.

2. The power distribution module of claim 1, wherein the wire connection end and the wire incoming end are arranged to be spaced apart in the height direction.

3. The power distribution module of claim 1, further comprising:

a handle arranged on an operation side of the body away from the connection side for being operated to slide the body in the installation direction.

4. The power distribution module of claim 1, wherein the body comprises an indication window arranged on an operation side of the body away from the connection side to expose at least a portion of the indication plate.

5. The power distribution module of claim 4, wherein when the indication plate is displaced relative to the body, identification information of the indication plate exposed from the indication window is changed, thereby facilitating a user to determine current position information.

6. The power distribution module of claim 1, wherein the position indication assembly further comprises:

a torsion spring having a first end coupled to the body and a second end coupled to the articulated arm, the torsion spring adapted to provide a torsion force to make the contact plate in close contact with the indication base block.

7. The power distribution module of claim 1, further comprising:

an interlocking member slidably connected to the body in the height direction, and adapted to, after the body slides to the operation position and the test position, be inserted into a corresponding hole on the fixed base plate so as to fix the body and the fixed base plate along the installation direction.

8. The power distribution module of claim 7, wherein the interlocking member completes unlocking by being displaced away and separated from the corresponding hole.

9. The power distribution module of claim 8, wherein the interlocking member is unlocked by suction.

10. The power distribution module of claim 8, wherein the interlocking member is unlocked mechanically or electronically.

11. The power distribution module of claim 10, wherein a user simultaneously controls sliding the body using the handle and controls unlocking of the interlocking member.

12. The power distribution module of claim 1, wherein the wire incoming end comprises:

a plurality of inserts each comprising an elastic protrusion adapted to be compressed during insertion of the plurality of inserts into a supply busbar of the junction box such that the plurality of inserts and the supply busbar are reliably electrically connected.

13. The power distribution module of claim 12, wherein a number of the inserts corresponds to a number of phases of a power supply to the supply busbar.

14. The power distribution module of claim 1, further comprising:

a pulley arranged on an underside of the body adjacent to the fixed base plate and adapted to be coupled with a slide rail on the fixed base plate during sliding of the body relative to the fixed base plate.

15. The power distribution module of claim 1, wherein the wire connection end includes a first outlet plug-in and the adapter end includes a second outlet plug-in.

16. The power distribution module of claim 15, wherein one of the first outlet plug-in or the second outlet plug-in includes one of a male plug-in or a female plug-in.

17. The power distribution module of claim 1, wherein in the test position, the wire incoming end is disconnected from the output end and the wire connection end is coupled to the adapter end.

18. A switchgear comprising:

a cabinet:

a fixed base plate fixedly coupled within the cabinet;

a power distribution module of claim 1, slidably arranged on the fixed base plate in a lateral direction; and a junction box adapted to be electrically connected to the power distribution module.

19. The switchgear of claim 18, wherein the fixed base plate comprises a plurality of slide rails arranged in the lateral direction, and adjacent ones of the slide rails are spaced apart by a predetermined distance, a length direction of each of the slide rails is arranged in an installation direction, and wherein a pulley of the power distribution module is arranged to be coupled to any one of the plurality of slide rails.

* * * * *